United States Patent
Lee

(10) Patent No.: US 6,619,381 B1
(45) Date of Patent: Sep. 16, 2003

(54) MODULAR HEAT DISSIPATING DEVICE

(76) Inventor: Chien-Te Lee, No. 3, Lane 31, Jen-Hsing St., Sanchung City, Taipei Hsien (TW)

( * ) Notice: Subject to any disclaimer, the term of this patent is extended or adjusted under 35 U.S.C. 154(b) by 0 days.

(21) Appl. No.: 10/104,388

(22) Filed: Mar. 21, 2002

(51) Int. Cl.⁷ .................................................. H05K 7/20
(52) U.S. Cl. ...................... 165/78; 165/80.3; 165/185; 174/16.3; 257/722; 361/704
(58) Field of Search ........................ 165/80.3, 78, 182, 165/185; 174/16.3; 257/722; 361/704

(56) References Cited

U.S. PATENT DOCUMENTS

| | | | | | |
|---|---|---|---|---|---|
| 2,434,676 A | * | 1/1948 | Spender | ...................... | 165/182 |
| 5,558,155 A | * | 9/1996 | Ito | .............................. | 165/80.3 |
| 6,104,609 A | * | 8/2000 | Chen | ........................... | 361/704 |
| 6,336,498 B1 | * | 1/2002 | Wei | ............................. | 165/80.3 |
| 6,340,056 B1 | * | 1/2002 | Huang et al. | ............... | 165/185 |
| 6,382,307 B1 | * | 5/2002 | Wang et al. | ................ | 165/80.3 |
| 6,449,160 B1 | * | 9/2002 | Tsai | ............................ | 361/704 |
| 6,474,407 B1 | * | 11/2002 | Chang et al. | .............. | 165/80.3 |

* cited by examiner

Primary Examiner—Leonard R. Leo
(74) Attorney, Agent, or Firm—Kolisch Hartwell, P.C.

(57) ABSTRACT

A modular heat dissipating device comprising multiple U-shaped fins connected to one another. Each fin includes an upper plate extending from an upper edge of the fin. At least one aperture is defined in the upper plate. A Y-shaped connector extends from the upper edge of the fin within the at least one aperture in the upper plate to engage with the at least one aperture in the upper edge of an adjacent fin. The Y-shaped connector has a leg connected to the upper edge of the fin and two wings extending beyond the edge of the upper plate. A lower plate extends from a lower edge of the fin and has at least one aperture defined in the lower plate. A Y-shaped connector extends from the lower edge of the fin within the at least one aperture in the lower plate to engage with the at least one aperture in the lower edge of an adjacent fin. The Y-shaped connector within the at least one aperture in the lower plate has a leg connected to the lower edge of the fin and two wings extending slightly beyond the edge of the lower plate.

4 Claims, 6 Drawing Sheets

MODULAR HEAT DISSIPATING DEVICE

BACKGROUND OF THE INVENTION

1. Field of the Invention

The present invention relates to a heat dissipating device, and more particularly to a modular heat dissipating device.

2. Description of Related Art

As is well known, the heat conductivity of copper is better than that of aluminum. However, most of conventional heat dissipating devices are made of aluminum because aluminum heat dissipating devices are easy to make at a low price. However, higher heat dissipating rates are required for current electronic machines. The heat dissipation requirement has exceeded the physical capability of aluminum. Current CPUs (central processing units), for example, operate at a frequency of over one gigahertz, and the heat generated by the CPU is directly proportional to the frequency so a heat dissipating device with a good heat dissipating rate is essential. Aluminum heat dissipating devices are made by injection molding so the number of fins that can be mounted in a fixed area is limited. With reference to FIG. 4, a modular copper heat dissipating device has been developed and marketed.

With reference to FIGS. 4 and 5, a conventional modular heat dissipating device in accordance with the prior art comprises multiple U-shaped fins (70) connected to one another. Each fin (70) has an upper plate (71) and a lower plate (72) perpendicularly extending from two opposite sides of the fin (70) to form the U-shape. The upper plate (71) has an aperture (711) defined in and near each end of the upper plate (71), and a connector (712) laterally extending from the upper plate (71) and received in an aperture (711') in an adjacent fin (70'). A boss (713) extends downward from the connector (712) to engage an upper edge (not numbered) of the adjacent fin (70'). The lower plate (72) is a mirror image of the upper plate (71). The lower plate (72) has an aperture (721), a connector (722) laterally extending from the lower plate (72) and a boss (723) extending upwardly from the connector (723) of the lower plate (72) to engage a lower edge (not numbered) of the adjacent fin (70').

With reference to FIG. 6, the multiple fins are connected to one another to form the heat dissipating device. The number of fins is dependent on the area of the heat source.

However, with reference to FIG. 7, the connection of the conventional modular heat dissipating device is weak. The multiple fins are easily detached from one another when the conventional modular heat dissipating device is bent.

The present invention has arisen to mitigate and/or obviate the disadvantages of the conventional modular heat dissipating device.

SUMMARY OF THE INVENTION

The main objective of the present invention is to provide a modular heat dissipating device that has a good connection between adjacent fins.

To achieve the objective, the modular heat dissipating device in accordance with the present invention includes multiple fins attached to one another. Each fin has an upper plate and a lower plate each having two apertures defined near two opposite ends of the upper plate and the lower plate. Each aperture of the upper plate and the lower plate contains a Y-shaped connector that is inserted into the aperture of an adjacent fin and bent inward to engage the opposite edge of the adjacent fin.

Further benefits and advantages of the present invention will become apparent during a careful reading of the detailed description with appropriate reference to the accompanying drawings.

DETAILED DESCRIPTION OF THE INVENTION

Figure 1:
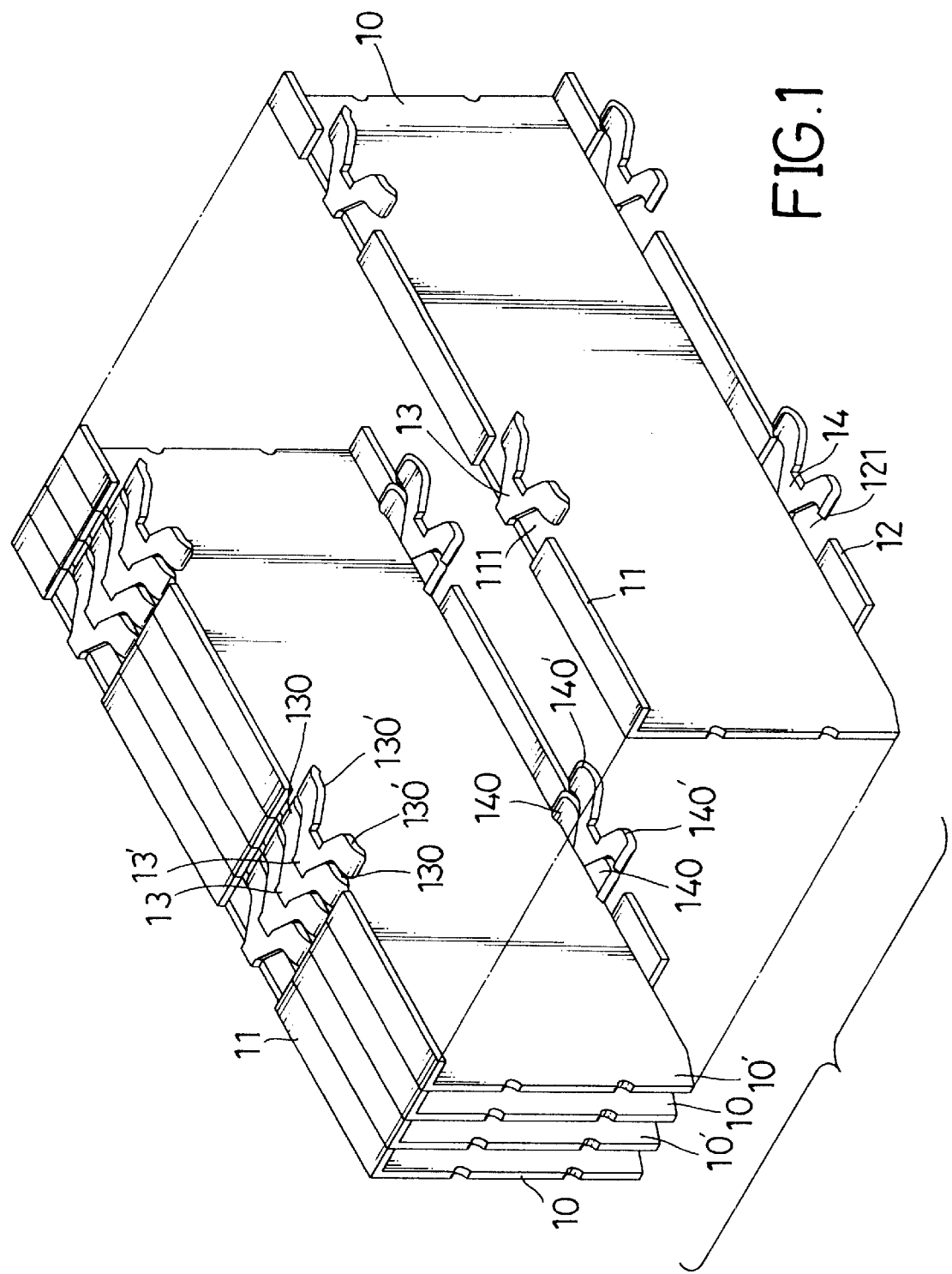
FIG. 1 is a partially exploded perspective view of a modular heat dissipating device in accordance with the present invention.
Figure 2:
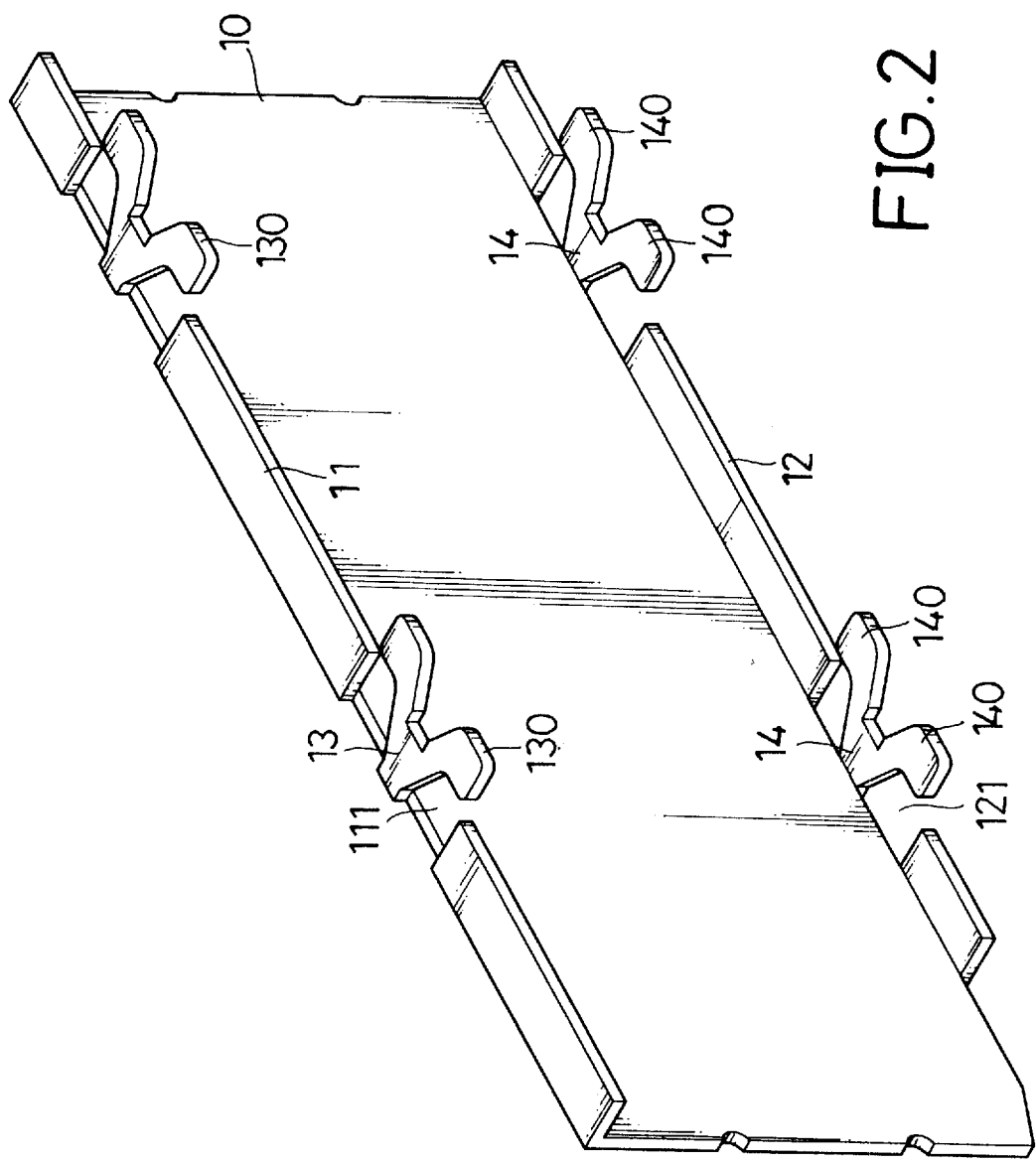
FIG. 2 is a perspective view of one of the fins of the modular heat dissipating device in FIG. 1.

With reference to the drawings and initially to FIGS. 1 and 2, a modular heat dissipating device in accordance with the present invention comprises multiple U-shaped fins (10) connected to one another.

Each fin (10) has an upper plate (11) and a lower plate (12) perpendicularly extending from two opposite edges of the fin (10) to form the U-shaped. The upper plate (11) includes at least one aperture (111) defined in the upper plate (11). In the preferred embodiment of the present invention, the upper plate (11) has two apertures (111) defined near opposite ends of the upper plate (11). A Y-shaped connector (13) perpendicularly extends from the fin (10) within each aperture (111). The connector (13) has a leg (not numbered) connected to an upper edge of the fin (10) and two wings (130) extending from the leg. The bottom of the wing (130) extends slightly beyond the free edge of the upper plate (11). The lower plate (12) is a mirror image of the upper plate (11). The lower plate (12) has two apertures (121) defined near opposite ends of the lower plate (12) and a Y-shaped connector (14) within each aperture (121) of the lower plate (12). Each connector (14) of the lower plate (12) has a leg (not numbered) connected to a lower edge of the fin (10) and two wings (140) extending from the leg of each connector (14) of the lower plate (12).

Figure 3:
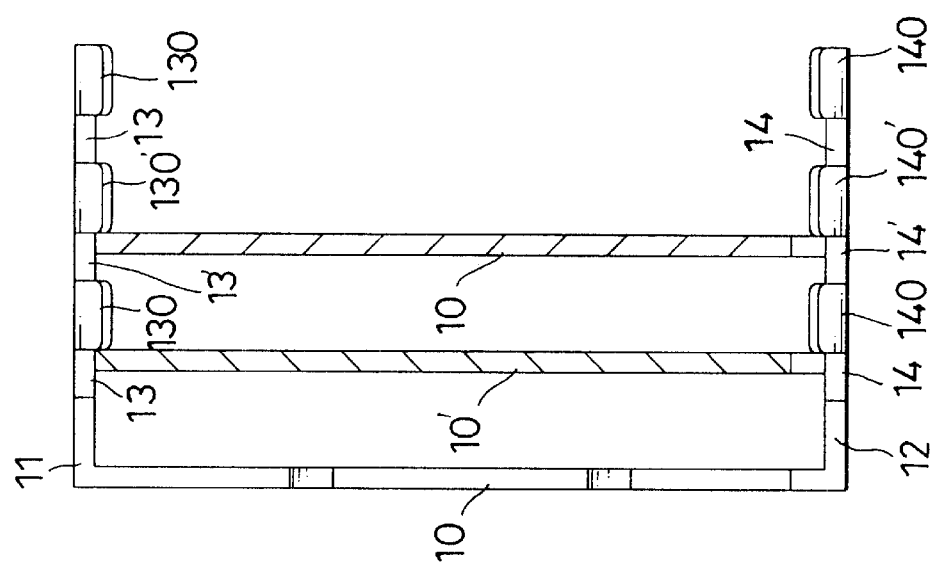
FIG. 3 is a side plan view in partial section of the modular heat dissipating device in FIG. 1.
Figure 4:
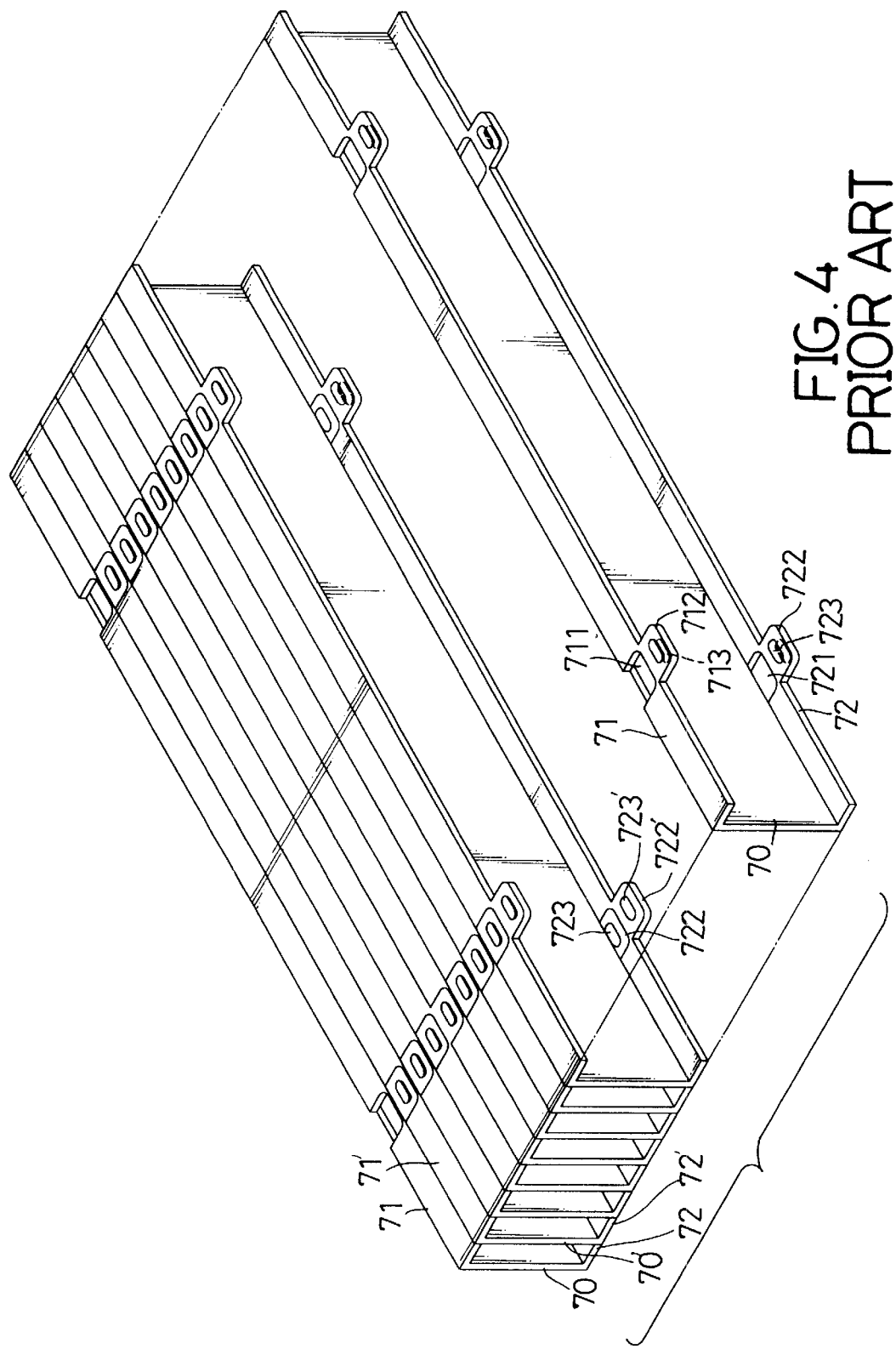
FIG. 4 is a partially exploded perspective view of a conventional modular heat dissipating device in accordance with the prior art.
Figure 5:
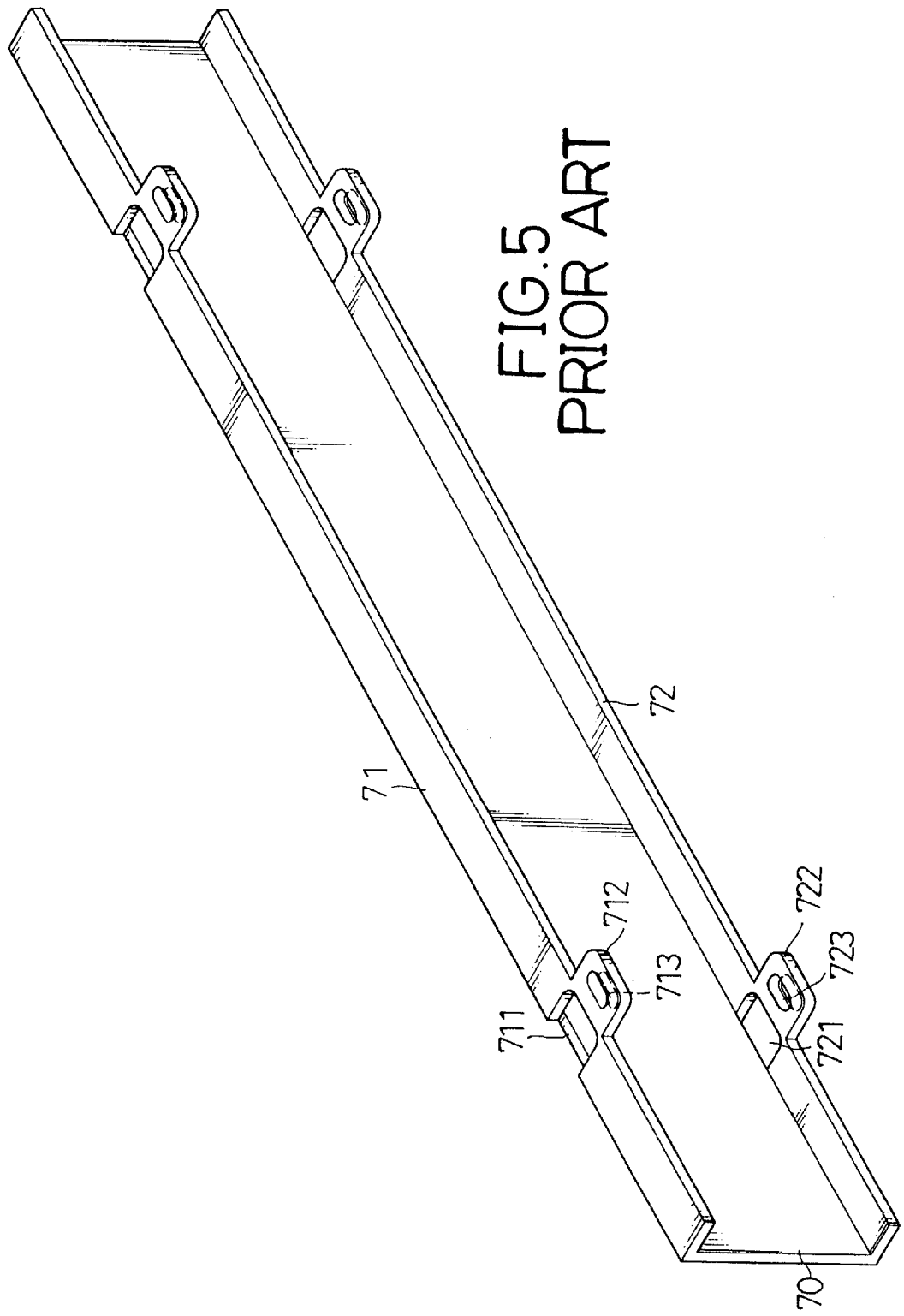
FIG. 5 is a perspective view of one of the fins of the modular heat dissipating device in FIG. 4.
Figure 6:
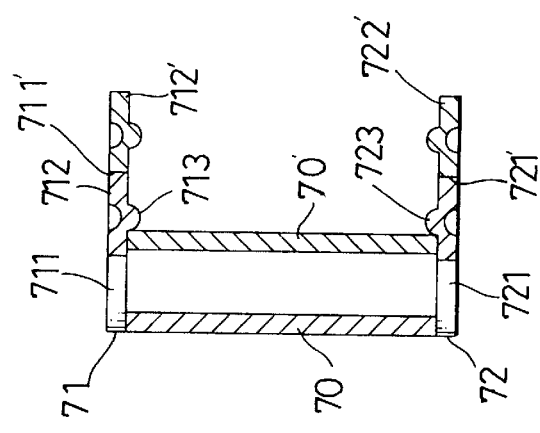
FIG. 6 is cross sectional side plan view of the conventional modular heat dissipating device in FIG. 4.
Figure 7:
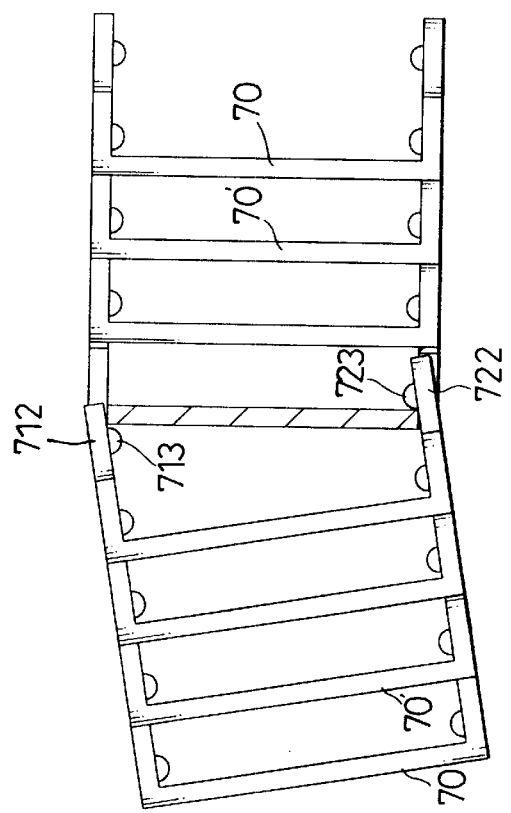
FIG. 7 is a side plan view in partial section of the conventional modular heat dissipating device in FIG. 4 when the modular heat dissipating device is bent.

To combine the fins (10), with reference to FIGS. 2 and 3, the Y-shaped connectors (13, 14) are inserted into the apertures (111', 121') of an adjacent fin (10'). The wings (130, 140) are bent inward to engage the adjacent fin (10) so that the fins (10, 10') are connected. The number of fins depends on the area of the heat source.

Each fin has four connectors and eight wings so there are eight connecting points between adjacent fins. Consequently, the connection of fins in accordance with the present invention is better than that of the conventional combined fins.

Although the invention has been explained in relation to its preferred embodiment, it is to be understood that many other possible modifications and variations can be made without departing from the spirit and scope of the invention as hereinafter claimed.

What is claimed is:

1. A modular heat dissipating device comprising:

multiple U-shaped fins connected to one another, each fin including:
- an upper plate extending from an upper edge of the fin and having at least one aperture defined in the upper plate;
- a Y-shaped connector extending from the upper edge of the fin within the at least one aperture in the upper plate to engage with the at least one aperture in the upper edge of an adjacent fin, the Y-shaped connector having a leg connected to the upper edge of the fin and two wings extending beyond the edge of the upper plate;
- a lower plate extending from a lower edge of the fin and having at least one aperture defined in the lower plate; and
- a Y-shaped connector extending from the lower edge of the fin within the at least one aperture in the lower plate to engage with the at least one aperture in the lower edge of an adjacent fin, the Y-shaped connector within the at least one aperture in the lower plate having a leg connected to the lower edge of the fin and two wings extending slightly beyond the edge of the lower plate.

2. The modular heat dissipating device as claimed in claim 1, wherein the upper plate comprises two apertures defined near opposite ends of the upper and the lower plate.

3. The modular heat dissipating device as claimed in claim 2, wherein the upper plate and the lower plate are mirror images of each other.

4. The modular heat dissipating device as claimed in claim 1, wherein the upper plate and the lower plate are mirror images of each other.

* * * * *